(12) United States Patent
Wen

(10) Patent No.: US 11,949,323 B2
(45) Date of Patent: Apr. 2, 2024

(54) POWER SOURCE SWITCH CIRCUIT

(71) Applicant: Shenzhen TCL Digital Technology Ltd., Guangdong (CN)

(72) Inventor: Dong Wen, Guangdong (CN)

(73) Assignee: Shenzhen TCL Digital Technology Ltd., Shenzhen (CN)

( * ) Notice: Subject to any disclaimer, the term of this patent is extended or adjusted under 35 U.S.C. 154(b) by 340 days.

(21) Appl. No.: 17/432,954

(22) PCT Filed: Mar. 9, 2020

(86) PCT No.: PCT/CN2020/078475
§ 371 (c)(1),
(2) Date: Aug. 23, 2021

(87) PCT Pub. No.: WO2020/182101
PCT Pub. Date: Sep. 17, 2020

(65) Prior Publication Data
US 2022/0158538 A1  May 19, 2022

(30) Foreign Application Priority Data
Mar. 14, 2019 (CN) .......................... 201910192689.5

(51) Int. Cl.
*H02M 1/08* (2006.01)
*H02M 3/155* (2006.01)
*H03K 17/687* (2006.01)

(52) U.S. Cl.
CPC ............. *H02M 1/08* (2013.01); *H02M 3/155* (2013.01); *H03K 17/687* (2013.01)

(58) Field of Classification Search
CPC .......... H02M 1/08; H02M 1/32; H02M 3/155; H02M 3/156; H03K 17/687
See application file for complete search history.

(56) References Cited

U.S. PATENT DOCUMENTS

| 5,376,831 | A | 12/1994 | Chen |
| 5,861,737 | A | 1/1999 | Goerke et al. |
| 6,335,654 | B1 * | 1/2002 | Cole ...................... G05F 1/565 |
| | | | 323/299 |

FOREIGN PATENT DOCUMENTS

| CN | 102594326 | 7/2012 |
| CN | 102904466 | 1/2013 |

(Continued)

OTHER PUBLICATIONS

Supplementary European Search Report and the European Search Opinion dated Oct. 21, 2022 From the European Patent Office Re. Application No. 20770654.0. (8 Pages).

*Primary Examiner* — Gary L Laxton

(57) ABSTRACT

A power source switch circuit include a switch, a switch control circuit configured to control the switch to be turned on/off, and a negative feedback circuit configured to feedback an output voltage of the switch. An input end of switch is connected to the switch control circuit, an output end of the switch is connected to a load circuit and the negative feedback circuit, and a control end of the switch is connected to the switch control circuit and the negative feedback circuit. The switch control circuit includes a bipolar transistor having a base, a collector and an emitter, a first resistor connected between the base and a control signal, a second resistor connected between the collector and the input end of the switch, and a third resistor connected between the collector and the control end of the switch.

18 Claims, 2 Drawing Sheets

(56) References Cited

FOREIGN PATENT DOCUMENTS

| | | |
|---|---|---|
| CN | 103529723 | 1/2014 |
| CN | 204376860 | 6/2015 |

* cited by examiner

POWER SOURCE SWITCH CIRCUIT

RELATED APPLICATIONS

This application is a National Phase of PCT Patent Application No. PCT/CN2020/078475 having International filing date of Mar. 9, 2020, which claims the benefit of priority of Chinese Patent Application No. 201910192689.5, filed on Mar. 14, 2019. The contents of the above applications are all incorporated by reference as if fully set forth herein in their entirety.

FIELD AND BACKGROUND OF THE INVENTION

The present disclosure relates to a power switch technology, and more particularly, to a power switch circuit.

A power switch circuit is often used in a circuit. For example, the home appliance may need to use power switch circuit to cut off the power supply of some electronic modules (to have a lower standby power) and resume the power supply when the modules are working. In addition, the power switch circuit needs to comply with the power supply timing when the power is provided to different modules to perform the power supply delay function.

Conventionally, the power switch circuit generates a huge impulse current at the time when the power switch circuit is instantly turned on and this impulse current introduces the serious issues:

1. The switch might be seriously impacted or even burned out. Here, a typical switch could be a metal-oxide-semiconductor (MOS) transistor (or a MOS field effect transistor FET).
2. The front-end power voltage may have a huge drop because a lot of charges instantly flow to the back-end. Due to the huge drop of the power voltage, the power voltage might be too low for the front-end circuits to normally work. In a worse scenario, the entire system might be shut down or damaged.
3. The over-current protection circuit of the back-end load circuit unit might be triggered. For example, the fuse might be broken or a protection mode might be activated such that the entire system cannot work.

SUMMARY OF THE INVENTION

One objective of an embodiment of the present disclosure is to provide a power switch circuit, which could simply and accurately determine the conductive time period and provide a stable output voltage rising speed and a constant conductive current during the conductive period, to alleviate the above-mentioned issues.

The present disclosure proposes the following technical schemes.

According to an embodiment of the present disclosure, a power switch circuit is disclosed. The power switch circuit comprises a switch circuit, a control circuit, and a negative feedback circuit. The switch control circuit is configured to control the switch circuit to be turned on/off. The negative feedback circuit connected to the switch control circuit, is configured to feedback an output voltage of the switch circuit. An input end of switch circuit is connected to the switch control circuit and a power, an output end of the switch circuit is connected to a load circuit and the negative feedback circuit, and a control end of the switch circuit is connected to the switch control circuit and the negative feedback circuit.

In the power switch circuit, the switch control circuit comprises a bipolar transistor, a first resistor, a second resistor, and a third resistor. The bipolar transistor includes a base, a collector and an emitter. The emitter is grounded. The first resistor is connected between the base and a control signal. The second resistor is connected between the collector and the input end of the switch circuit. The third resistor is connected between the collector and the control end of the switch circuit.

In the power switch circuit, the negative feedback circuit comprises a fourth resistor, a first capacitor connected between the output end of the switch circuit and the fourth resistor, and a first diode. The first diode includes a cathode and an anode. The cathode is connected to the third resistor, an end of the fourth resistor and the control end of the switch circuit. The anode is connected to another end of the fourth resistor and the first capacitor.

In the power switch circuit, the switch circuit comprises a first metal-oxide-semiconductor (MOS) transistor. The first MOS transistor includes a gate connected to the cathode of the first diode, the third resistor and the fourth resistor, a source connected to the power and the second resistor, and a drain connected to the load circuit and the first capacitor.

In the power switch circuit, the first MOS transistor is a P-channel MOS transistor.

In the power switch circuit, voltage fed to the input end of the switch circuit is 12V.

In the power switch circuit, a resistance of the second resistor is 10K ohms.

In the power switch circuit, a capacitance of the first capacitor is 0.47 mF.

On the power switch circuit, the power switch circuit further comprises a load capacitor. An end of the load capacitor is connected to the output end of the switch circuit, the load circuit and the negative feedback circuit, and another end of the load capacitor is grounded.

In contrast to prior art, the present disclosure proposes a power switch circuit. The power switch circuit comprises a switch circuit, a control circuit, and a negative feedback circuit. The switch control circuit is configured to control the switch circuit to be turned on/off. The negative feedback circuit connected to the switch control circuit, is configured to feedback an output voltage of the switch circuit. An input end of switch circuit is connected to the switch control circuit and a power, an output end of the switch circuit is connected to a load circuit and the negative feedback circuit, and a control end of the switch circuit is connected to the switch control circuit and the negative feedback circuit. The power switch circuit could simply and accurately determine the conductive time period and provide a stable output voltage rising speed and a constant conductive current during the conductive period by using the negative feedback circuit to feedback the output voltage to the switch circuit.

BRIEF DESCRIPTION OF THE SEVERAL VIEWS OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF SPECIFIC EMBODIMENTS OF THE INVENTION

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

Figure 1:
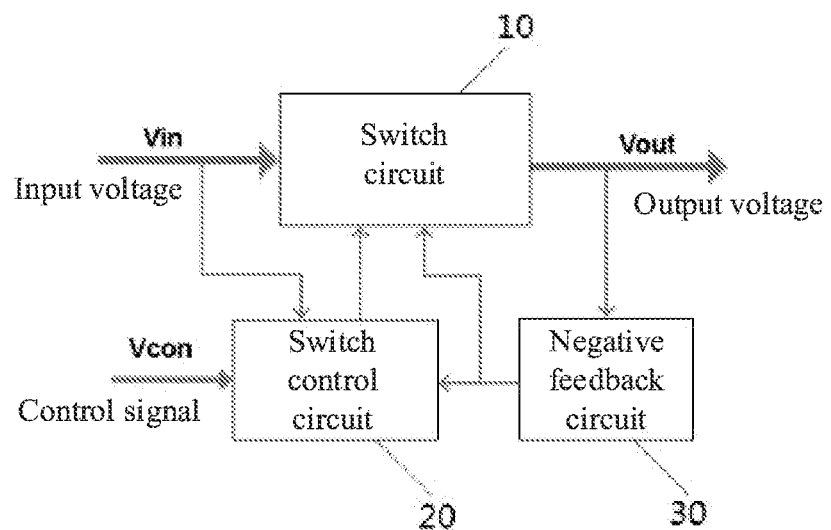
FIG. 1 is a block diagram of a power switch circuit according to an embodiment of the present disclosure.

Please refer to FIG. 1. FIG. 1 is a block diagram of a power switch circuit according to an embodiment of the present disclosure. The power switch circuit is an ideal power switch circuit, which could be widely used in all kinds of electronic devices, home appliances, information products, automotive electronics, and avionics.

The power switch circuit comprises a switch circuit 10;
a switch control circuit 20; and
a negative feedback circuit 30.

The switch control circuit 20 is configured to control the switch circuit 10 to be turned on/off. The negative feedback circuit 30 is connected to the switch control circuit 20 and is configured to feedback an output voltage of the switch circuit 10 to the switch circuit 10. The input end of switch circuit 10 is connected to the switch control circuit 20 and a power, the output end of the switch circuit 10 is connected to a load circuit and the negative feedback circuit 30, and the control end of the switch circuit 10 is connected to the switch control circuit 20 and the negative feedback circuit 30.

The present disclosure utilizes the negative feedback circuit 30 to get the signal from the output stage of the switch circuit 10. This replaces the delay circuit that gets the signal from the input stage of the switch circuit 10 in the conventional power switch circuit. By using the negative feedback circuit 30 to introduce the output voltage variance of the switch circuit 10 to the control end of the switch circuit 10, the present disclosure could simply and accurately determine the conductive time period and provide a stable output voltage rising speed and a constant conductive current during the conductive period.

Figure 2:
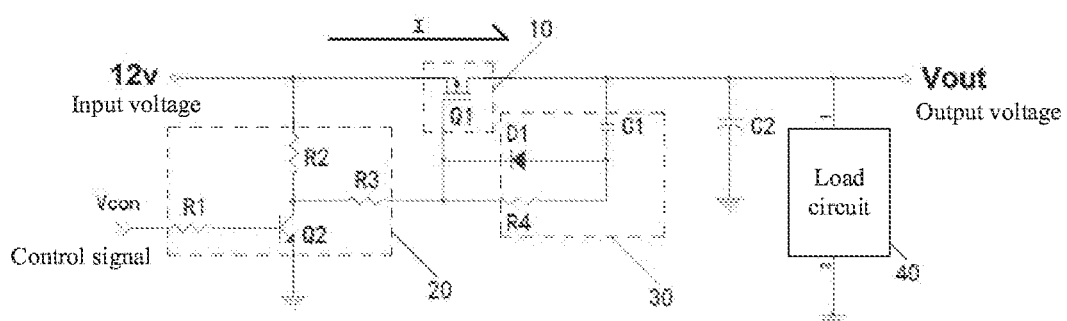
FIG. 2 is a circuit diagram of a power switch circuit according to an embodiment of the present disclosure.

Please refer to FIG. 2. FIG. 2 is a circuit diagram of a power switch circuit according to an embodiment of the present disclosure. In this embodiment, the first MOS transistor Q1 is used as a switch circuit 10. The first MOS transistor Q1 is a P-channel MOS transistor. The MOS transistor Q1 is turned on if the voltage Vgs is lower than a certain value. The gate of the first MOS transistor Q1 is connected to the switch control circuit 20 and the negative feedback circuit 30. The source of the first MOS transistor Q1 is connected to the switch control circuit 20 and the power. The drain of the first MOS transistor Q1 is connected to the back-end load circuit 40 and the negative feedback circuit 30.

The switch control circuit 20 a bipolar transistor Q2, a first resistor R1, a second resistor R2 and a third resistor R3. The base of the bipolar transistor Q2 is connected to an end of the first resistor R1. The collector of the bipolar transistor Q2 is connected to an end of the second resistor R2 and an end of the third resistor R3. Another end of the second resistor R2 is connected to the power and the source of the first MOS transistor Q1. Another end of the third transistor R3 is connected to the negative feedback circuit 30 and the gate of the first MOS transistor Q1. The emitter of the bipolar transistor Q2 is connected to the ground.

By controlling the voltage level of the input control signal of the base of the first bipolar transistor Q2, the present disclosure could turn on/off the first bipolar transistor Q2 to control the voltage variance of the gate of the first MOS transistor Q1 and thus the switch circuit 10 is controlled to be turned on/off.

Please refer to FIG. 2 again. The negative feedback circuit comprises: a first diode D1, a first capacitor C1 and a fourth resistor R4. The cathode of the first diode D1 is connected to another end of the third resistor R3, an end of the fourth resistor R4 and the gate of first MOS transistor Q1. The anode of the first diode D1 is connected to another end of the fourth resistor R4 and an end of the first capacitor C1. Another end of the first capacitor C1 is connected to the drain of the first MOS transistor Q1 and the backend load circuit 40.

The first diode D1 is used as a bypass diode. The first diode D1 could allow the first MOS transistor to be in a critical conductive state when the first diode D1 is turned on and could feedback the 100% rising variance of the output voltage of the drain of the first MOS transistor Q1 to the gate of the first MOS transistor Q1. The voltage division circuit, including the third resistor R3 and the fourth resistor R4, ensures that the first MOS transistor Q1 will not be incorrectly turned on when the power is provided to the entire circuit.

The power switch circuit further comprises a load capacitor C2. An end of the load capacitor C2 is connected to the output end of the switch circuit 10, the load circuit 40 and the negative feedback circuit 30. Another end of the load capacitor C2 is connected to a ground. The load capacitor C2 could work as a filter and perform a filtering operation on the voltage outputted from the switch circuit 10 to the load circuit 40.

Figure 3:
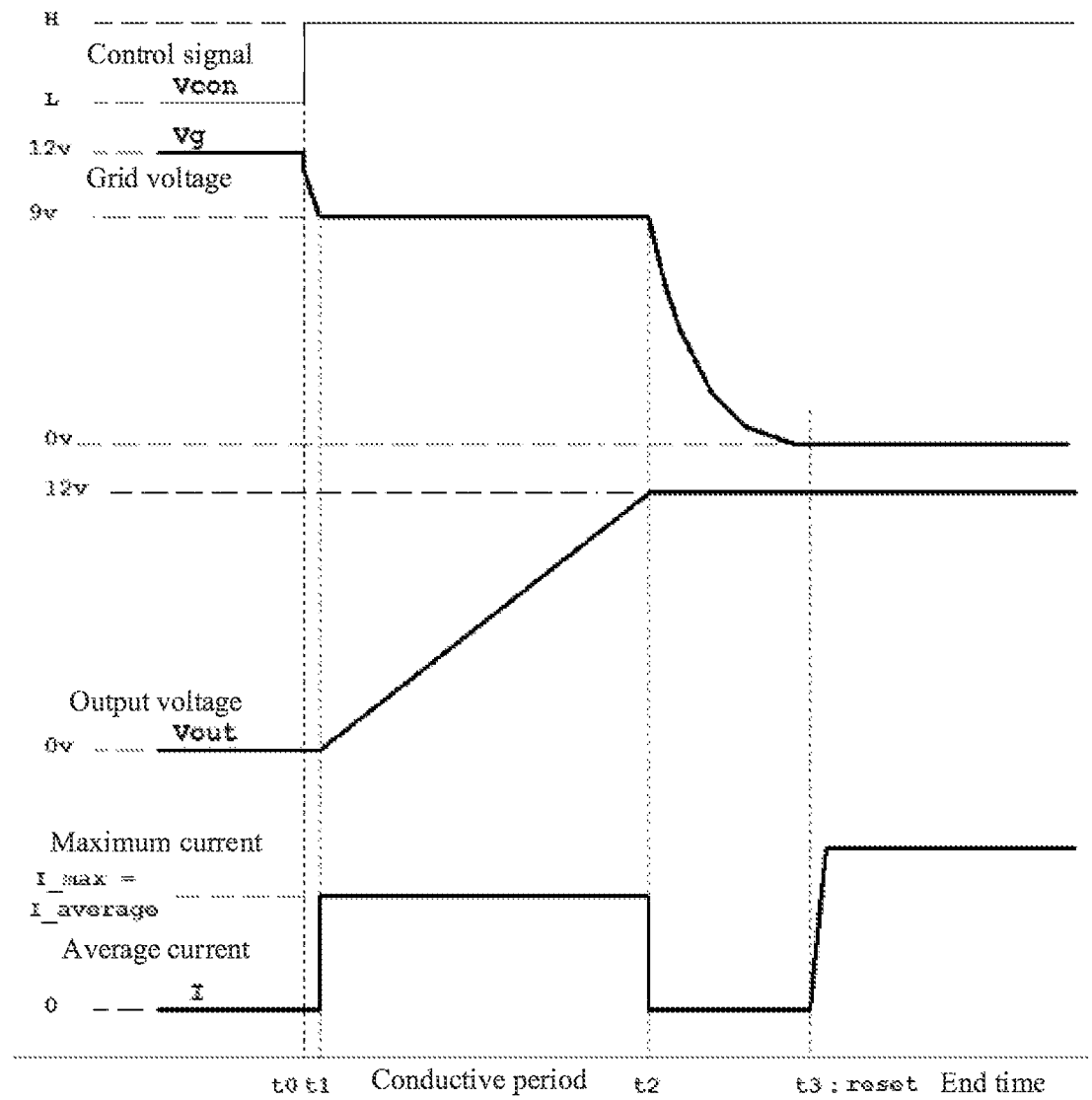
FIG. 3 is a waveform diagram of a power switch circuit according to an embodiment of the present disclosure.

In order to better understand the present disclosure, the present disclosure provides a specific embodiment. Here, the power inputs a voltage of 12V. The first resistor R1, the second resistor R2 and the third resistor R3 all have a resistance of 10 k ohms. The fourth resistor R4 has a resistance of 330 k ohms. The first capacitor C1 has a capacitance of 0.47 mF. The load capacitor C2 has a capacitance of 470 mF. Please refer to FIG. 3. FIG. 3 is a waveform diagram of a power switch circuit according to an embodiment of the present disclosure. The operation of the power switch circuit is illustrated as below:

1. By using the negative feedback circuit 30, the first MOS transistor Q1 has a constant current when the first MOS transistor Q1 is turned on. The rising speed of the output voltage is constant and thus the impact on the front-end and backend and the first MOS transistor Q1 could be effectively alleviated.
2. The conductive time period of the first MOS transistor Q1 could be accurately determined without the influence of the conductive V-I characteristic, the capacitance of the load capacitor C2, and the amplitude of the load current. The conductive time (t2−t1) could be represented by the following equation:

$$t2-t1=12v*Cf*R1/9v.$$

Here, Cf is the capacitance of the first capacitor and R1 is the resistance of the first resistor.

3. The time parameter Cf*R1 in the above equation is pretty small. This could sufficiently ensure that the gate voltage Vg of the first MOS transistor Q1 is very close to 0V when the load circuit 40 starts to work. At this time, the first MOS transistor Q1 is completely turned on (conductive).

Therefore, the present disclosure adopts a novel negative feedback circuit in the power switch circuit. Through the capacitor, the diode and the resistors, the variance of the output voltage is inputted back to the gate of the first MOS transistor. this could have an accurately-determined conductive time period, a constant conductive current and a constant output voltage rising speed and efficiently solve the issues of the conventional power switch circuit.

From the above, the present disclosure proposes a power switch circuit. The power switch circuit comprises a switch circuit, a control circuit, and a negative feedback circuit. The switch control circuit is configured to control the switch circuit to be turned on/off. The negative feedback circuit connected to the switch control circuit, is configured to feedback an output voltage of the switch circuit. An input end of switch circuit is connected to the switch control circuit and a power, an output end of the switch circuit is connected to a load circuit and the negative feedback circuit, and a control end of the switch circuit is connected to the switch control circuit and the negative feedback circuit. The power switch circuit could simply and accurately determine the conductive time period and provide a stable output voltage rising speed and a constant conductive current during the conductive period by using the negative feedback circuit to feedback the output voltage to the switch circuit.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A power switch circuit, comprising:
    a switch;
    a switch control circuit, configured to control the switch to be turned on/off; and
    a negative feedback circuit connected to the switch control circuit, configured to feedback an output voltage of the switch;
    wherein an input end of the switch is connected to the switch control circuit and a power, an output end of the switch is connected to a load circuit and the negative feedback circuit, and a control end of the switch is connected to the switch control circuit and the negative feedback circuit,
    wherein the switch control circuit comprises:
    a bipolar transistor, having a base, a collector and an emitter, wherein the emitter is grounded;
    a first resistor, connected between the base and a control signal;
    a second resistor, connected between the collector and the input end of the switch; and
    a third resistor, connected between the collector and the control end of the switch.

2. The power switch circuit of claim 1, wherein the switch comprises:
    a first metal-oxide-semiconductor (MOS) transistor, having a gate connected to the switch control circuit and the negative feedback circuit, a source connected to the switch control circuit and the power, and a drain connected to the load circuit and the negative feedback circuit.

3. The power switch circuit of claim 1, wherein the negative feedback circuit comprises:
    a fourth resistor;
    a first capacitor, connected between the output end of the switch and the fourth resistor; and
    a first diode, having a cathode and an anode, wherein the cathode is connected to the third resistor, an end of the fourth resistor and the control end of the switch; and the anode is connected to another end of the fourth resistor and the first capacitor.

4. The power switch circuit of claim 3, wherein the switch comprises:
    a first MOS transistor, having a gate connected to the cathode of the first diode, the third resistor and the fourth resistor, a source connected to the power and the second resistor, and a drain connected to the load circuit and the first capacitor.

5. The power switch circuit of claim 4, wherein the first MOS transistor is a P-channel MOS transistor.

6. The power switch circuit of claim 4, wherein voltage fed to the input end of the switch is 12V.

7. The power switch circuit of claim 4, wherein a resistance of the first resistor is 10K ohms.

8. The power switch circuit of claim 4, wherein a resistance of the second resistor is 10K ohms.

9. The power switch circuit of claim 4, wherein a resistance of the third resistor is 10K ohms.

10. The power switch circuit of claim 4, wherein a resistance of the fourth resistor is 330K ohms.

11. The power switch circuit of claim 4, wherein a capacitance of the first capacitor is 0.47 mF.

12. The power switch circuit of claim 4, wherein the first MOS transistor is turned on for a time period of t2−t1=12v*Cf*R1/9v where Cf represents a capacitance of the first capacitor, and R1 represents a resistance of the first resistor.

13. The power switch circuit of claim 1, further comprising:
    a load capacitor;
    wherein an end of the load capacitor is connected to the output end of the switch, the load circuit and the negative feedback circuit, and another end of the load capacitor is grounded.

14. The power switch circuit of claim 13, wherein a capacitance of the load capacitor is 470 mF.

15. An electronic device, comprising a power switch circuit, the power switch circuit comprising:
    a switch;
    a switch control circuit, configured to control the switch circuit to be turned on/off; and
    a negative feedback circuit connected to the switch control circuit, configured to feedback an output voltage of the switch;
    wherein an input end of the switch is connected to the switch control circuit and a power, an output end of the switch is connected to a load circuit and the negative feedback circuit, and a control end of the switch is connected to the switch control circuit and the negative feedback circuit,
    wherein the switch control circuit comprises:
    a bipolar transistor, having a base, a collector and an emitter, wherein the emitter is grounded;
    a first resistor, connected between the base and a control signal;

a second resistor, connected between the collector and the input end of the switch; and a third resistor, connected between the collector and the control end of the switch.

16. The power switch circuit of claim 15, wherein the switch comprises:

a first metal-oxide-semiconductor (MOS) transistor, having a gate connected to the switch control circuit and the negative feedback circuit, a source connected to the switch control circuit and the power, and a drain connected to the load circuit and the negative feedback circuit.

17. The power switch circuit of claim 15, wherein the negative feedback circuit comprises:

a fourth resistor;

a first capacitor, connected between the output end of the switch and the fourth resistor; and a first diode, having a cathode and an anode, wherein the cathode is connected to the third resistor, an end of the fourth resistor and the control end of the switch; and the anode is connected to another end of the fourth resistor and the first capacitor.

18. The power switch circuit of claim 17, wherein the switch comprises:

a first MOS transistor, having a gate connected to the cathode of the first diode, the third resistor and the fourth resistor, a source connected to the power and the second resistor, and a drain connected to the load circuit and the first capacitor.

\* \* \* \* \*